US006272742B1

(12) United States Patent
Armezzani et al.

(10) Patent No.: US 6,272,742 B1
(45) Date of Patent: Aug. 14, 2001

(54) METHOD OF ELECTRICALLY CONNECTING SUBSTRATES USING SOLDER BALLS

(75) Inventors: Gregg J. Armezzani, Endwell, NY (US); Kishor V. Desai, Fremont, CA (US); Jeffery S. Perkins, Hauppauge; John J. Pessarchick, Binghamton, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/415,330

(22) Filed: Oct. 8, 1999

Related U.S. Application Data

(62) Division of application No. 09/044,966, filed on Mar. 19, 1998.

(51) Int. Cl.$^{7}$ ..................... H05K 3/36

(52) U.S. Cl. ..................... 29/830; 29/825; 29/840

(58) Field of Search ..................... 29/825, 830, 840, 29/846; 228/180.22

(56) References Cited

U.S. PATENT DOCUMENTS 5,456,004 * 10/1995 Swamy .
5,543,586 * 8/1996 Crane, Jr. et al. .

* cited by examiner

*Primary Examiner*—Carl J. Arbes
(74) *Attorney, Agent, or Firm*—Lawrence R. Fraley

(57) ABSTRACT

A method is provided for connecting two conductive layers in an electronic circuit package comprising the steps of placing one or more blind vias in a first substrate positioned on top of a first conductor; placing one or more blind vias in a second substrate positioned under a second conductor; attaching one or more signal lines to one or more of the one or more blind vias; and assembling ball grid array components such that the first conductor is electrically connected to the second conductor. Also claimed is an electronic circuit package incorporating the blind vias for electrical connection between layers in accordance with the present invention.

5 Claims, 2 Drawing Sheets

10
36
38
22
20
30
28
37
34
32
18
63/37
16
26
24
14
12

METHOD OF ELECTRICALLY CONNECTING SUBSTRATES USING SOLDER BALLS

This application is a division of Ser. No. 09/044,966 filed Mar. 19, 1998.

TECHNICAL FIELD OF THE INTENTION

The present invention relates to electronic circuit packages such as printed wiring boards and laminate chip carriers with a blind via used in place of a land connected to a plated through hole. The blind via then connects one or more internal layers of the electronic circuit package to a surface land.

BACKGROUND OF THE INVENTION

Electronic circuits contain many (sometimes millions) of components such as resistors, capacitors, inductors, diodes, electromechanical switches, and transistors. High density packaging of electronic components is particularly important to allow fast access to large amounts of data in computers. High density electronic circuit packages also are important in high frequency devices and communications devices. The components are connected to form circuits and circuits are connected to form functioning devices. The connections perform power and signal distribution. In a multi-layer electronic circuit package, some layers of the package serve as conductors and other layers serves as signal planes, depending on the operational requirements of the device. The devices require mechanical support and structural protection. The circuits themselves require electrical energy to function. The functioning devices, however, produce heat, or thermal energy which must be dissipated so that the devices do not stop functioning. Moreover, while high density packaging of a number of components can improve performance of the device, the heat produced by the power-consuming components can be such that performance and reliability of the devices is adversely impacted. The adverse impact arises from electrical problems such as increased resistivity and mechanical problems such as thermal stress caused by increased heat.

Electronic circuit packages, such as chips, modules, circuit cards, circuit boards, and combinations of these, thus must meet a number of requirements for optimum performance. The package must be structurally sturdy enough to support and protect the components and the wiring. In addition, the package must be capable of dissipating heat and must have a coefficient of thermal expansion that is compatible with that of the components. Finally, to be commercially useful, the package should be inexpensive to produce and easy to manufacture.

High density packages necessarily involve increased wiring density and thinner dielectric coatings between layers in a multi-layer electronic circuit package. The layers in a multi-layer package typically are electrically connected by vias and through-holes. The term "via" is used for a conductive pathway between adjacent layers in a multi-layer electronic circuit package. The term "through-hole" is used for a conductive pathway that extends to a non-adjacent layer.

Presently, a widely used technique for achieving such electrical connection, is to provide vias having a metal plated on the walls of the vias. However, plating is a relatively expensive process including the processing steps of cleaning, seeding or catalyzing the walls and then plating with the desired metal such as copper. Because of the relative expense associated with plating, alternatives have been suggested to provide electrical conductivity in unplated vias, whether through-holes or blind vias. The alternative methods include providing solder-paste-filled blind vias, solder balls in blind vias, solder-filled through-holes, solder rings, and copper powder mixed into solder paste. Each of these methods depend on the solder bridging unplated/unsoldered prepreg.

For high density packages the through-holes are increasingly narrow in diameter and the through-holes in each layer must be aligned precisely. The through-holes and vias are likely to be plated at least where they connect at either end. The routing of lines in a dense electronic circuit package is made more difficult by surface joining features that typically are formed as lands connected to plated through-holes or vias.

The land and through hole/via features also limit the density of the interconnect pattern. More particularly, each conductor site must be separated from other sites by a certain amount of dielectric material which limits the density of the sites.

SUMMARY OF THE INVENTION

It is an object of this invention to provide an electronic circuit package with blind vias forming electrical connections between a first conductive layer and a second conductive layer.

A further object of this invention is to provide an electronic circuit package that uses blind vias manufactured to specifications such that the amount of solder from ball grid array joints that enter the blind vias is limited such that the joint is not starved for lack of solder.

A third object of this invention is to provide methods of fabrication of electronic circuit packages with blind vias forming electrical connections between a first conductive layer and a second conductive layer.

Accordingly, a method is provided for connecting two conductive layers in an electronic circuit package comprising the steps of placing one or more blind vias in a first substrate positioned on top of a first conductor; placing one or more blind vias in a second substrate positioned under a second conductor; attaching one or more signal lines to one or more of the one or more blind vias; and assembling ball grid array components such that the first conductor is electrically connected to the second conductor using the blind vias. Also claimed is an electronic circuit package incorporating the blind vias for electrical connection between conductive layers in accordance with the present invention.

It is an advantage of the present invention that the blind vias provide electrical connection between two conductive layers of the electronic circuit package.

It is a further advantage that the blind vias are manufactured to be compatible with the use of a ball grid array that uses solder for the joints of the array.

It is a further advantage of the invention that the need for lands separate from the through-holes/vias is eliminated thereby permitting higher density of electrical connections.

Other features and advantages of the present invention will become apparent in the following detailed description of the preferred embodiment of the invention taken in conjunction with the accompanying drawings.

DETAILED DESCRIPTION OF THE INVENTION

The present invention is of an electronic circuit package using blind vias to provide connection between two conductive circuits. In addition, the blind vias can be manufactured to be compatible with the use of solder for joints in a ball grid array. This eliminates the need for lands around the openings of a through hole/via and, therefore, permits higher density of connections. In this application the term "blind via" is used to refer to a partial depth conductive via. The invention can best be understood by reference to the drawings.

Figure 1:
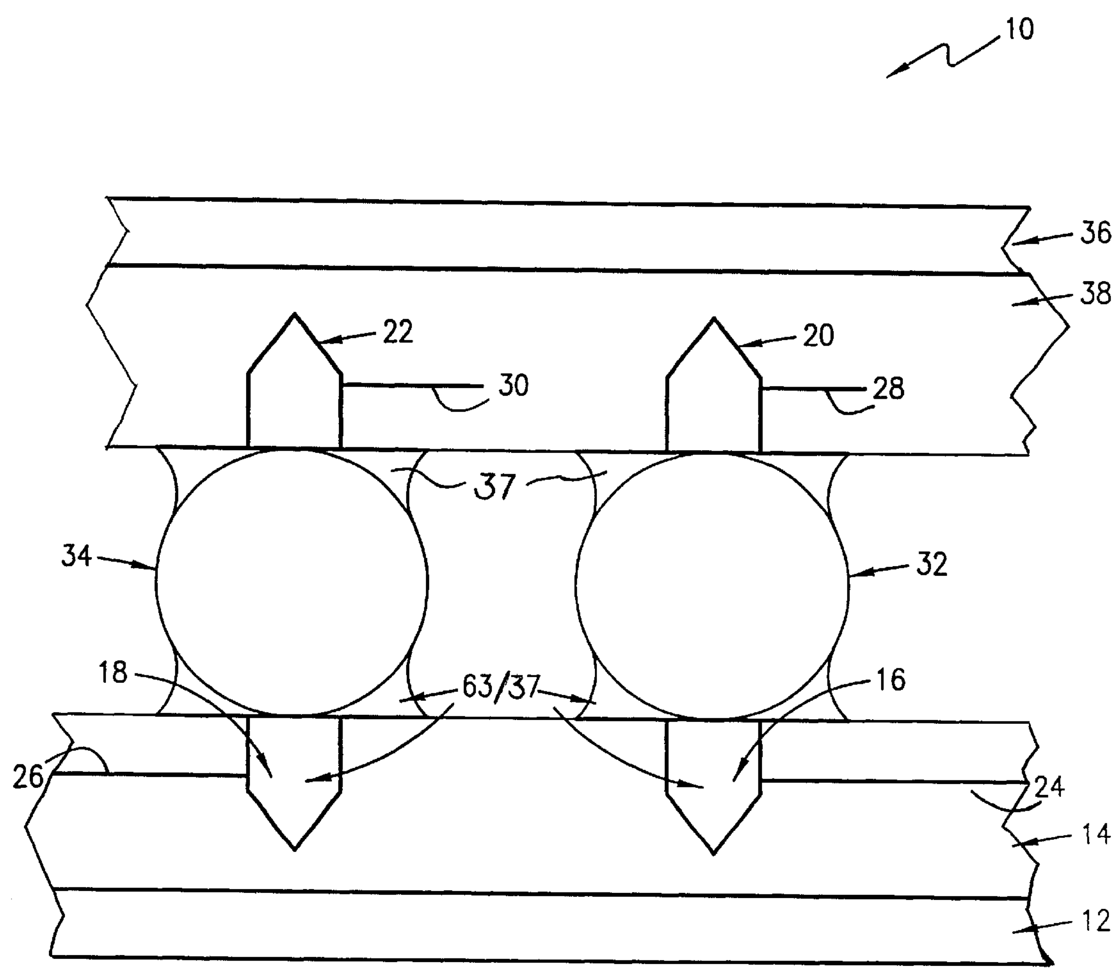
FIG. 1 is a depiction of layers of a multi-layer electronic circuit package using blind vias for electrical connections, in accordance with the present invention.

FIG. 1 illustrates sample layers 10 of an electronic circuit package in accordance with the present invention. Referring to FIG. 1, at the bottom of the layers 10 is a first conductor 12. On top of the first conductor 12 is a first substrate 14 such as a printed wiring board core or subcomposite. The first substrate 14 preferably is composed of a dielectric material such as a laminated resin impregnated cloth/metal composite, a polyimide/metal composite, a teflon/metal composite, a ceramic/metal composite, or other suitable material.

FIG. 1 shows, as an example, four blind vias, labeled 16, 18, 20, and 22, respectively. The shape of the blind vias 16, 18, 20, and 22 in FIG. 1 is illustrative only. Other shapes are possible and may be preferable for a given application. The blind vias can be formed by any standard electronic circuit package fabrication technique, such as drilling or laser drilling. From each blind via 16, 18, 20, and 22, extends a corresponding signal line, labeled 24, 26, 28, and 30, respectively. The direction and placement of the signal lines is illustrative only. Other placements and directions are possible and within the scope of the invention. Multiple signal lines per blind via also are within the scope of the invention.

Also shown in FIG. 1 are two solder balls, 32 and 34. The use of spherical shaped balls in electronic circuit packages is well-known in the art. With the increase in the number of input/output leads extending from electronic devices, such as integrated circuits, ball grid array (BGA) packages have been developed. A BGA package is a type of packaged electronic device in which at least one electronic device, such as an integrated circuit chip, is mounted to a substrate and an electrical connection to an electrically conductive material not part of the packaged electronic device, such as a printed circuit board, is made by an array of solder balls located on a surface of the substrate.

The solder ball 32 is positioned to cover the openings of blind vias 16 and 20. The solder ball 34 is positioned to cover the openings of blind vias 18 and 22. No particular effort is needed to achieve such positioning. The balls will be naturally held in place over the openings of the vias. The solder balls 32 and 34 typically are of BGA size but can be as small as C4 scale, and are composed of eutectic or high melt tin/lead alloys. Other size solder balls and solder balls of a different composition are possible and are within the scope of the invention.

This invention also applies to other interconnect methods and materials such as conductive epoxy, gold-to-gold diffusion, welding, solder paste, and solder plated copper balls.

Solder (37) typically is used at the joints of the solder balls 32 and 34. The size of the blind vias in comparison to the solder balls is important and should be structured such that the amount of solder entering the blind vias is controlled. Further, the amount of solder used should be sufficient to ensure that none of the joints are starved for solder if some of the solder does fall into one or more of the blind vias.

Located above blind vias 20 and 22 is a second conductor 36. The blind vias 20 and 22 and signal lines 28 and 30 are in a second substrate 38 such as a printed wiring board core or laminate chip carrier or other layers of the electronic circuit package. The second substrate 38 typically is made of a dielectric such as a laminated resin impregnated cloth/metal composite, polyimide/metal composite, teflon/metal composite, ceramic/metal composite, or other suitable material. Alternatively, the second substrate 38 could be a semiconductor device such as silicon, germanium, or galliumarsenide. By means of the blind vias, the solder balls, and the signal lines, the first conductor 12 is electrically connected to second conductor 36.

As shown in FIG. 1, using blind vias and solder balls eliminates the need for lands around the beginning point and ending point of through-holes and vias. Arrangements such as those in FIG. 1 permit higher density of electrical connections. Also as shown in Figure L, the blind vias are compatible with the use of solder balls in a ball grid array that uses solder for the joints of the array.

Figure 2:
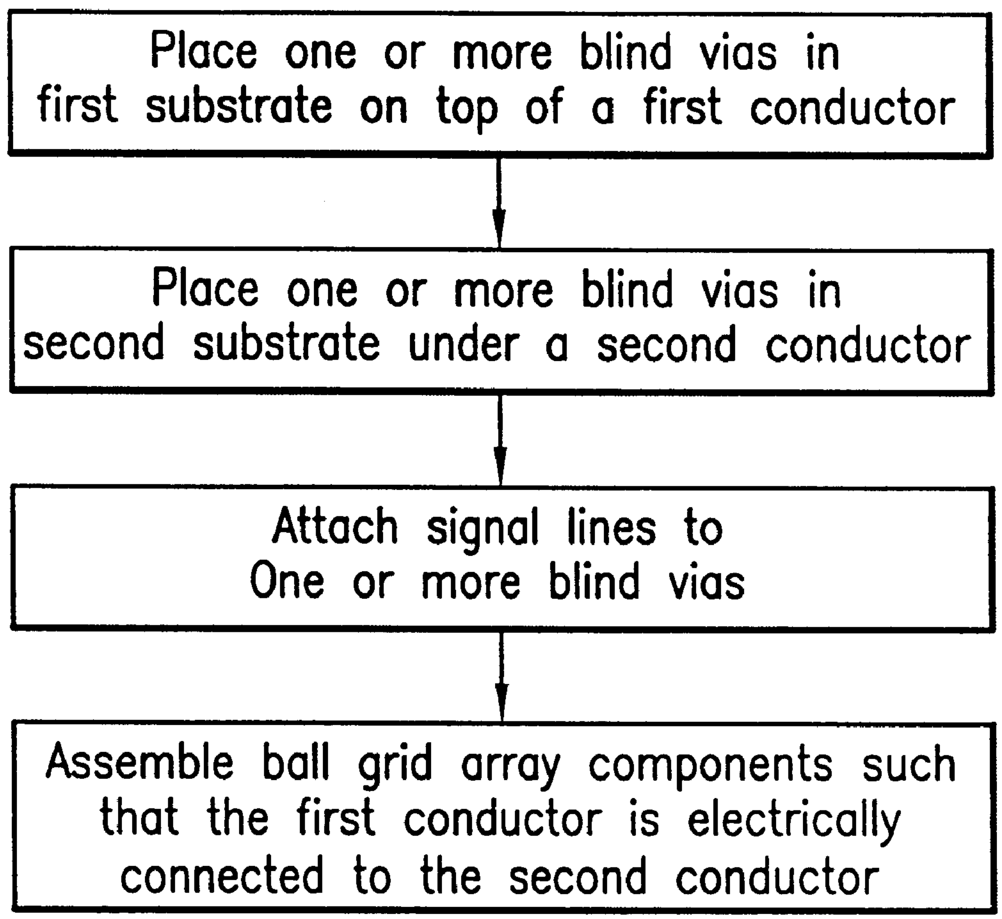
FIG. 2 is a flow chart of one method of the present invention.

The assembly of the layers shown in FIG. 1 is summarized in FIG. 2, which describes the steps of the method. Namely, once the first conductor 12 is constructed, the first substrate 14 such as a printed wiring board/electronic circuit package substrate 14 is placed on top of the first conductor 12 using any one of many standard techniques in the industry. Blind vias 16 and 18 then are placed in the first substrate 14 by drilling, laser drilling, or any other suitable technique. Signal lines 24 and 26 are attached to blind vias 16 and 18, respectively.

Blind vias 20 and 22 are drilled, laser drilled or otherwise placed in second substrate 38. Signal lines 28 and 30 are attached to blind vias 20 and 22, respectively. Second conductor 36 is constructed on second substrate 38.

The ball grid array components then are assembled with standard assembly processing, including depositing solder paste (37), placing solder balls such as 32 and 34, and subsequent reflow. Solder reflow involves the controlled thermal excursion of the assembly above the melting point of the solder to form an alloy with the base metal on the components. Upon cooling, this alloy hardens and forms a fixed conductive (electrical or thermal) path between circuit lines to interconnect two or more components together.

63/37 is the lowest melt tin/lead alloy. Its melting point is 183° C.; however, it is typical to exceed this temperature during reflow to achieve 0.5 to 1.5 minutes duration in the molten state. This insures good wetting and proper alloying with the base metal. Typical peak temperatures range from 210–230° C.

Note that the blind via depth and diameter must be within limits such that too much solder from the solder paste does not enter the via. If that occurs, the solder joints may be starved for solder, which is undesirable. In the preferred embodiment of the invention, the blind vias are in the range of 0.002" in diameter to one-fourth of the diameter of the solder balls.

The depth and diameter of the blind vias also should be controlled to minimize voiding the blind vias. Proper selection of the solder paste or solder ball/flux combination and reflow profile are essential to minimize voiding the blind via. Examples of suitable solder paste include solvent cleanable, water soluble, or no clean mixtures of fine tin/lead eutectic alloy solder powder, a fluxing agent such as polymerized or unpolymerized rosin whose primary constituent is abietic acid, a suitable solvent such as tallow alcohol or benzyl alcohol, and any number of non-active thickener or binder components. However, this will vary depending on the specific application, the size of the solder balls, and the width of the blind vias.

It is important to note that the present invention does not require filling the blind vias with solder paste. Rather, the present invention anticipates that the blind vias will be partly filled with solder paste during the reflow process, but such partial filling is not required.

An alternative method for assembly of the ball grid array components would be to pass the layers 10 through a solder process prior to the ball grid array assembly process. This could be accomplished using a process similar to a hot air solder leveling process. That is, a process where components are dipped or passed over molten solder and blown off with high incident angle heated air flow to level the molten solder on the component and remove the excess. Upon cooling, the component is left with a uniform protective layer of solder on all exposed metal surfaces.

Alternatively, the solder paste could be deposited and reflowed prior to placement of the solder balls of the ball grid array. The alternative method under certain circumstances could allow greater control over the placement of solder at the joints versus inside the blind vias.

Although specific embodiments have been described herein for purposes of illustration, various modifications may be made without departing from the spirit or scope of the invention.

What is claimed is:

1. A method for electrically connecting first and second substrates each having at least one signal line therein in an electronic circuit package, said method comprising the steps of:

placing one or more blind vias in said first substrate;

placing one or more blind vias in said second substrate;

electrically connecting one or more of said signal lines in each of said first and second substrates to one or more of said one or more blind vial in said first and second substrates, respectively;

electrically connecting said one or more of said blind vias in said first substrate with respective ones of said one or more of said blind vias in said second substrate by positioning one or more solder balls over the openings of said substrates and providing solder paste relative to said one or more solder balls; and thereafter performing a solder reflow operation.

2. The method of claim 1 wherein said solder reflow operation occurs at a temperature of from about 210° C. to about 230° C.

3. The method of claim 1 wherein said one or more of said blind vias in both said first and second substrates is provided by laser drilling.

4. The method of claim 1 further including providing a first conductor and positioning said first substrate on said first conductor.

5. The method of claim 1 further including providing a second conductor and positioning said second substrate on said second conductor.

* * * * *